(12) United States Patent
Ishikawa et al.

(10) Patent No.: US 9,112,132 B2
(45) Date of Patent: Aug. 18, 2015

(54) RESISTANCE-VARIABLE MEMORY DEVICE

(75) Inventors: Takayuki Ishikawa, Kanagawa-ken (JP); Yoshifumi Nishi, Aachen (DE); Dalsuke Matsushita, Kanagawa-ken (JP); Masato Koyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/605,746

(22) Filed: Sep. 6, 2012

(65) Prior Publication Data

US 2013/0250656 A1 Sep. 26, 2013

(30) Foreign Application Priority Data

Mar. 21, 2012 (JP) ................... 2012-064549

(51) Int. Cl.
*G11C 11/00* (2006.01)
*H01L 45/00* (2006.01)
(52) U.S. Cl.
CPC ............ *H01L 45/04* (2013.01); *H01L 45/1233* (2013.01); *H01L 45/145* (2013.01)
(58) Field of Classification Search
CPC ................... G11C 13/0004; G11C 13/0069
USPC .................................................. 365/148, 163
See application file for complete search history.

(56) References Cited

U.S. PATENT DOCUMENTS

| 7,791,060 B2 * | 9/2010 | Aochi et al. ................ 257/5 |
| 2007/0290186 A1 * | 12/2007 | Bourim et al. ............ 257/4 |
| 2008/0089121 A1 | 4/2008 | Aochi et al. |
| 2009/0045429 A1 * | 2/2009 | Kang et al. ................. 257/99 |
| 2010/0271859 A1 * | 10/2010 | Osano et al. ............... 365/148 |
| 2011/0069533 A1 * | 3/2011 | Kurosawa et al. ......... 365/148 |
| 2011/0170331 A1 | 7/2011 | Oh et al. |
| 2012/0091420 A1 * | 4/2012 | Kusai et al. ................ 257/4 |
| 2012/0211719 A1 | 8/2012 | Haimoto et al. |

FOREIGN PATENT DOCUMENTS

WO 2012-127718 A1 9/2012

OTHER PUBLICATIONS

Eike Linn et al., Complementary resistive switches for passive nanocrossbar memories, Nature Materials, vol. 9, May 2010, pp. 403-406.

* cited by examiner

*Primary Examiner* — Huan Hoang
(74) *Attorney, Agent, or Firm* — Patterson & Sheridan, LLP

(57) ABSTRACT

A memory device includes a first electrode, a second electrode, a third electrode, a first variable resistance layer between the first electrode and the third electrode, and a second variable resistance layer between the second electrode and the third electrode. The first, second, and third electrodes, and the first and second variable resistance layers are formed of materials that cause the first variable resistance layer to transition from a high resistance state to a low resistance state when a voltage is applied across the first and second electrodes and maintain the high resistance state when the voltage is cut off, and cause the second variable resistance layer to transition from a high resistance state to a low resistance state when the voltage is applied across the first and second electrodes and transition from the high resistance state to the low resistance state when the voltage is cut off.

18 Claims, 12 Drawing Sheets

RESISTANCE-VARIABLE MEMORY DEVICE

CROSS-REFERENCE TO RELATED APPLICATION

This application is based upon and claims the benefit of priority from Japanese Patent Application No. 2012-064549, filed Mar. 21, 2012; the entire contents of which are incorporated herein by reference.

FIELD

Embodiments described herein relate generally to a resistance-variable memory device whose resistance value is electrically variable.

BACKGROUND

Resistance-variable memories (ReRAM: resistive random access memory) are nonvolatile memories in which the storage device part consists of a two-terminal structure in which a variable resistance layer is sandwiched by two electrodes. Since the cell structure is simple, scaling is easier than with other memories. For this reason, NAND type flash memories, which are utilized as large-capacity semiconductor storage devices, are promising candidates to be the next-generation large-capacity storage devices that will replace existing products.

As variable-resistance materials of the resistance-variable memories, various substances such as the transition metal oxide group, sulfide group, perovskite oxide group, and semiconductors have been used. To realize a large-capacity storage device using these resistance-variable memories, it is necessary to use a cross point type of memory structure.

In the cross point type of memory structure, a current leak (stray current) can result from a sneak current during write, readout, and erase operations. The occurrence of this leak current increases the power consumed by a device or hinders normal operations.

In order to avoid this problem, it is necessary to connect rectifying elements to resistance-variable elements in series, in order to provide a rectifying function to memory cells. However, since combining the rectifying elements such as diodes with the resistance-variable elements leads directly to an increase in the device size, it is difficult to attain a large capacity. Accordingly, it is more desirable to build leak-current suppression features, such as a rectification features, into the resistance-variable elements.

DETAILED DESCRIPTION

In general, embodiments will be explained with reference to the figures. Here, in the following figures and explanation, the same symbols will be given to constituent elements which have appeared earlier in the figures and have the same functions and constitutions. Additional explanations of these elements will be carried out only as needed.

According to the embodiment, there is provided a resistance-variable memory device that has a leak current suppression function and enables a stable memory operation.

An embodiment of the resistance-variable memory device is characterized in that it is provided with a first electrode containing at least one of W, Al, Ti, In, Ga, V, Cr, Nb, Zr, Mg, and Hf; a second electrode containing at least one of Pt, Au, Zn, Pd, and Ir; a third electrode which is arranged between the first electrode and the second electrode and contains at least one of Pt, Au, Zn, Pd, and Ir; a first variable resistance layer that is arranged between the first electrode and the third electrode and formed of a metal oxide; and a second variable resistance layer that is arranged between the second electrode and the third electrode and formed of a metal oxide.

(Embodiment 1)

Figure 1:
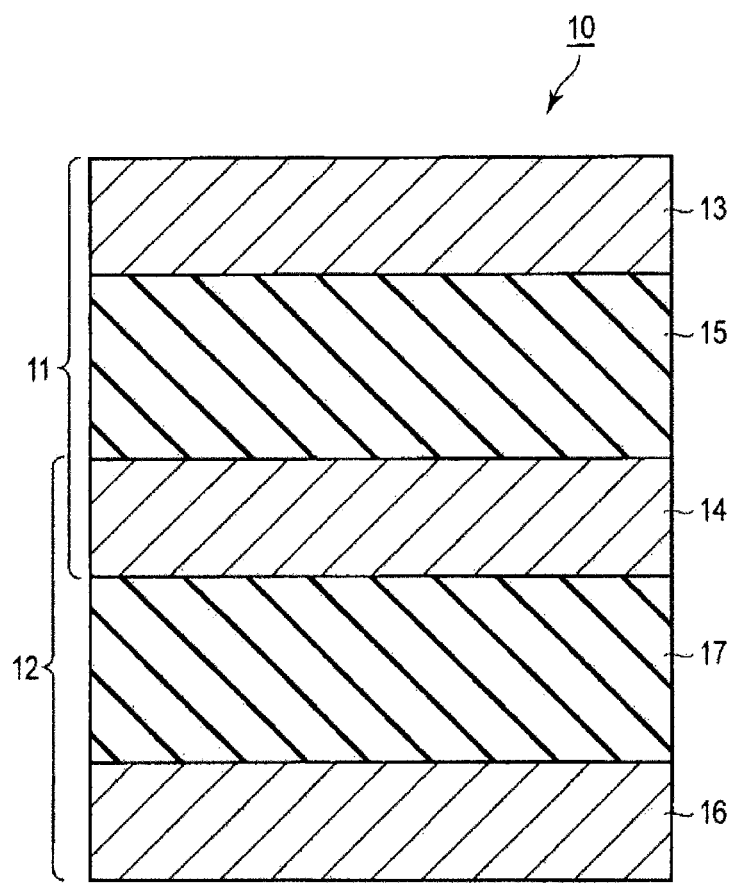
FIG. 1 is a cross section showing the structure of a resistance-variable memory device according to a first embodiment.

FIG. 1 is a cross section showing the structure of a resistance-variable memory device according to a first embodiment.

As shown in the figure, the resistance-variable memory device 10 has a basic structure provided with a resistance-variable element 11 and a resistance-variable element 12. The resistance-variable element 11 has electrode 13, electrode 14, and variable resistance layer 15 arranged between the electrodes 13 and 14. The resistance-variable element 12 has electrode 14, electrode 16, and variable resistance layer 17 arranged between the electrodes 14 and 16.

In other words, the electrode (third electrode) 14 is arranged between the electrode (first electrode) 13 and the electrode (second electrode) 16. Between the electrodes 13 and 14, the variable resistance layer 15 is arranged. In addition, the variable resistance layer 17 is arranged between the electrodes 14 and 16.

The resistance-variable element 11 and the resistance-variable element 12 are electrically connected in series via the electrode 14. As the method for connecting the resistance-variable element 11 and the resistance-variable element 12, a structure is used in which the resistance-variable element 11 and the resistance-variable element 12 are stacked in a direction perpendicular to the surface of a substrate. In this structure the resistance-variable element 11 and the resistance-variable element 12 are stacked, and the electrode 14 is between the two resistance-variable elements, and is a common electrode. Other structures can also be used. For example, one such additional structure involves the resistance-variable element 11 and the resistance-variable element 12 being arranged on the substrate surface and the common electrode 14 is installed so as to be in contact with both resistance-variable elements 11 and 12.

FIG. 1 shows the structure in which the resistance-variable element 11 and the resistance-variable element 12 are stacked. Both the resistance-variable element 11 and the resistance-variable element 12 are so-called resistance-variable memory devices in which the resistance value of the variable resistance layer therein changes as a voltage is applied. The variable resistance layer moves to a low-resistance state as a write voltage is applied, and the variable resistance layer moves to a high-resistance state as an erase voltage is applied. In addition, both the resistance-variable element 11 and the resistance-variable element 12 are so-called bipolar resistance-variable elements in which the write-voltage applying direction is opposite to the erase-voltage applying direction.

The resistance-variable element 11 has a good data retention (write-state holding characteristic). In other words, its variable-resistance layer 15 remains in a low-resistance state, even if the voltage is cut off after application of the voltage lowers the resistance of the variable-resistance layer 15. On the other hand, the resistance-variable element 12 has a poor data retention (write-state holding characteristic). In other words, its variable-resistance layer 17 moves to a high-resistance state soon after the voltage is cut off after application of the voltage lowers its resistance. This difference in the data retention (write-state holding characteristic) can be realized by selecting particular combinations of electrodes and variable-resistance layers. Typical data retention of the resistance-variable element 11 is between 10 days and 20 years, and that of the resistance-variable element 12 is a few seconds or less.

Figure 2:
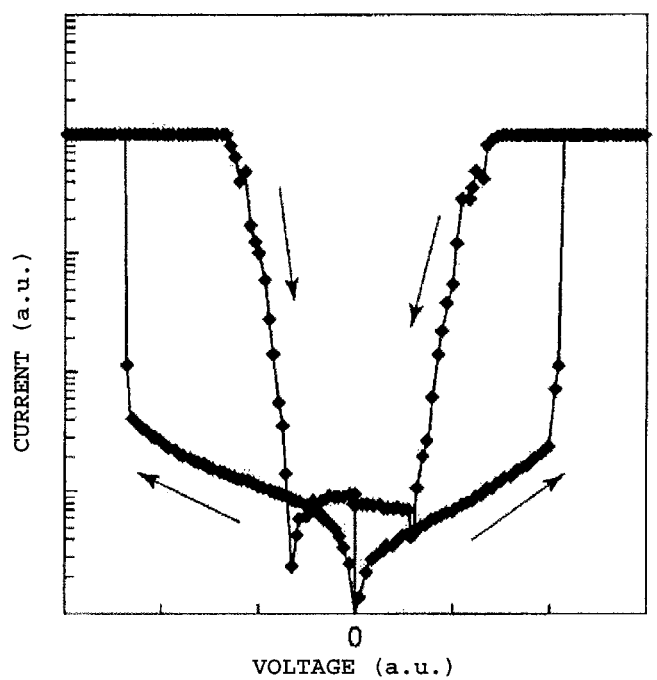
FIG. 2 shows a current-voltage characteristic of a resistance-variable element of the first embodiment.

In addition, the resistance-variable element 12 exhibits nearly equivalent switching characteristics under positive and negative biasing. FIG. 2 shows an example current-voltage characteristic (hereinafter, I-V characteristic) of the resistance-variable element 12. In FIG. 2, there are nearly identical (equivalent) I-V characteristics at a given positive voltage and the corresponding negative voltage of equal magnitude. However, such symmetry is not a necessary feature of the resistance-variable element 12. The resistance-variable element 12 may move to a low-resistance state (set state) at both a positive voltage and a negative voltage which is not equivalent in magnitude to the positive voltage at which movement occurs.

In the resistance-variable memory device of the present invention, the resistance-variable element 11 acts as an information storage layer and maintains an erased state which takes the form of a high-resistance state (here, "0") and a written state which takes the form of a low-resistance state (here, "1"). In addition, the resistance-variable element 12 acts as a leak-current suppression layer for suppressing leak current generated in a nonselective cell by a sneak current during write, readout, and erase operations. In this embodiment, a memory device is provided which suppresses the current leak caused by a sneak current in a cross point structure. The suppression is achieved by utilizing the high resistance state of resistance-variable elements 12 in nonselective cells.

When the resistance-variable memory device is in the "0" state, both the resistance-variable element 11 and the resistance-variable element 12 are in a high-resistance state, and when the resistance-variable memory device is in the "1" state, the resistance-variable element 11 is in a low-resistance state and the resistance-variable element 12 is in a high-resistance state. In the resistance-variable memory device of this embodiment, the difference between the "0" state and "1" state is that the "0" state is associated with a high-resistance state of the resistance-variable element 11, while the "1" state is associated with a low-resistance state of the resistance-variable element 11. Thus, with this configuration, when the resistance-variable memory device 11 is in either the "0" or "1" state, because the resistance-variable element 12 maintains a high-resistance state, a sneak current in the cross point type structure can be suppressed.

Next, the write, erase, and read operations in the resistance-variable memory device of the first embodiment will be explained with reference to FIG. 3A to FIG. 6C. In these figures, a high-resistance state is indicated by "HRS," and a low-resistance state is indicated by "LRS."

First, the write operational states of the components in the resistance-variable memory device of the first embodiment will be explained.

Figure 3A:
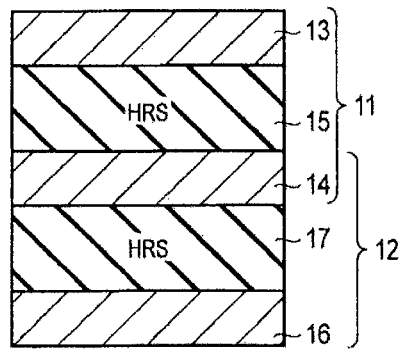
FIGS. 3A to 3C are cross sections showing a write operation of the resistance-variable memory device of the first embodiment.
Figure 3B:
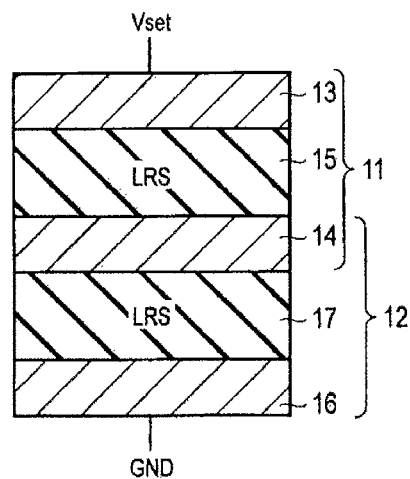
Figure 3C:
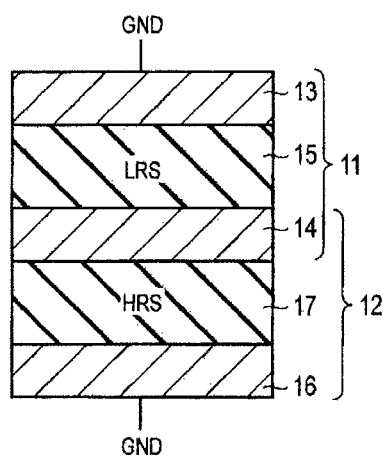

FIGS. 3A to 3C are cross sections showing operational states associated with the write operation of the resistance-variable memory device of the first embodiment.

FIG. 3A shows the initial state before writing in the resistance-variable memory. Here, the resistance-variable memory device is in the "0" state. The write operation, as shown in FIG. 3B, is executed by first applying a write voltage Vset to electrode 13, while electrode 16 is grounded.

By applying the positive voltage Vset to electrode 13, an electric field is generated between electrodes 13 and 16, and is oriented, from electrode 13, in the direction of electrode 16. Here, the positive applied voltage Vset is a voltage sufficient for lowering the resistance of both variable resistance layers 15 and 17. For this reason, both the variable resistance layers 15 and 17 move to a low-resistance state.

Next, as shown in FIG. 3C, the applied voltage Vset is cut off. As a result, the variable resistance layer 17 cannot maintain the low-resistance state and moves to the high-resistance state. In this manner, the written state, that is, the "1" state, is realized. In other words, cutting-off the write voltage results in the variable resistance layer 15 being maintained in the low-resistance state, and the variable resistance layer 17 moving to the high-resistance state, thereby bringing about the "1" state.

In the following paragraphs, the erase operation in the resistance-variable memory device of the first embodiment will now be explained.

FIGS. 4A to 4D are cross sectional diagrams showing operational states of resistance-variable memory device components during the steps of the erase operation of the first embodiment.

Figure 4A:
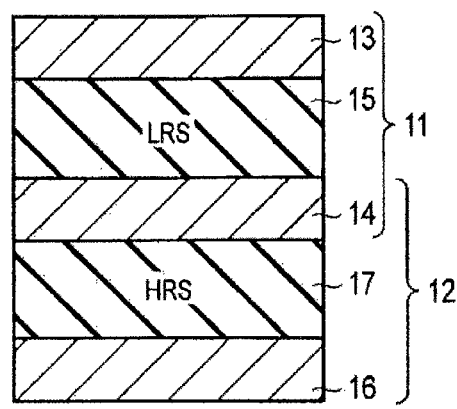
FIGS. 4A to 4D are cross sections showing an erase operation of the resistance-variable memory device of the first embodiment.
Figure 4B:
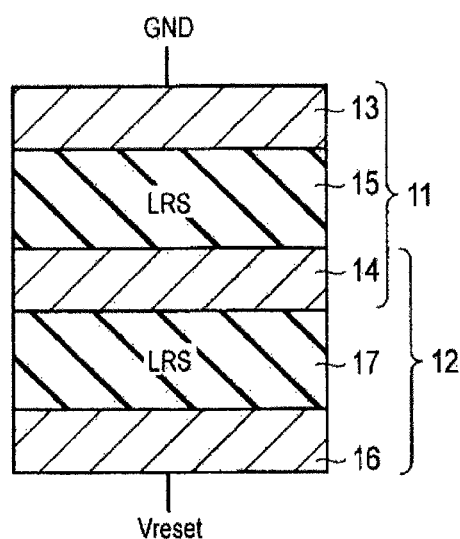

FIG. 4A shows the operational state in which the resistance-variable memory is in the "1" state. The erase operation is carried out by setting the voltage applying direction to be opposite to the voltage applying direction during the write operation. In other words, as shown in FIG. 4B, a positive erase voltage Vreset for resetting the resistance-variable element 11 is applied to the electrode 16. As mentioned above, the resistance-variable element 12 can move to the lower resistance state when a positive or a negative bias exists. For this reason, the variable resistance layer 17 moves from a high-resistance state to a low-resistance state when the voltage Vreset is applied to electrode 16.

Figure 4C:
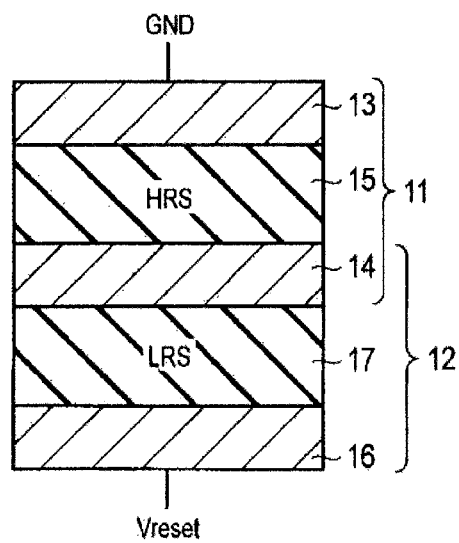
Figure 4D:
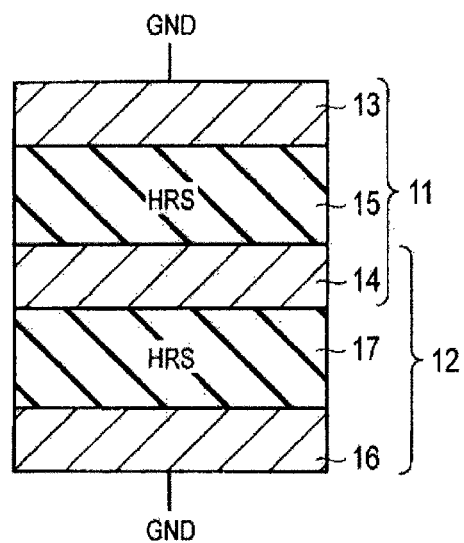

As a result, because variable resistance layer 17 moves to a low-resistance state, the voltage across layer 15 increases, moving the variable resistance layer 15 to a high-resistance state as shown in FIG. 4C. If the applied voltage is then cut off, the variable resistance layer 17 moves to a high-resistance state as shown in FIG. 4D.

The operation described above results in both the resistance-variable element 11 and the resistance-variable element 12 being in the "0" state, that is, the high-resistance state. The voltage Vreset required for the above erase operation is a voltage value sufficient for lowering the resistance of the variable resistance layer 17 and for causing the variable resistance layer 15 to move to a high-resistance state.

Next, the read operation in the resistance-variable memory device of the first embodiment will be explained.

Figure 5A:
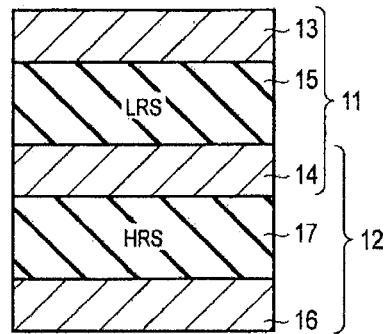
FIGS. 5A to 5C are cross sections showing a read operation of the resistance-variable memory device of the first embodiment.
Figure 5B:
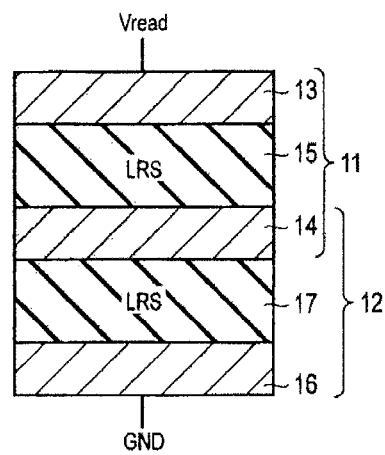
Figure 5C:
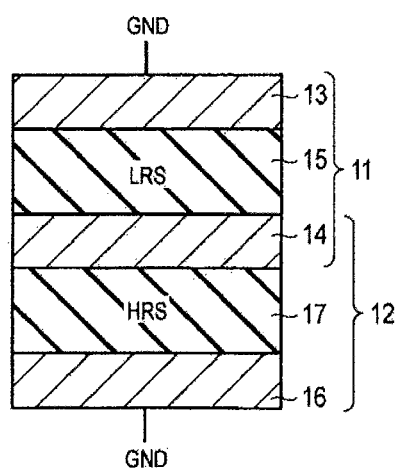
Figure 6A:
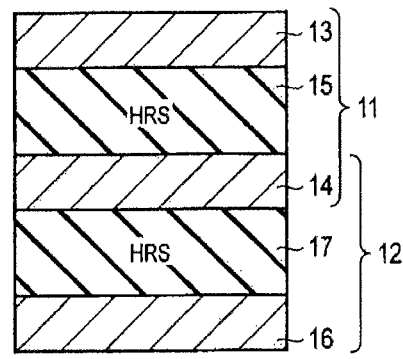
FIGS. 6A to 6C are cross sections showing the read operation of the resistance-variable memory device of the first embodiment.
Figure 6B:
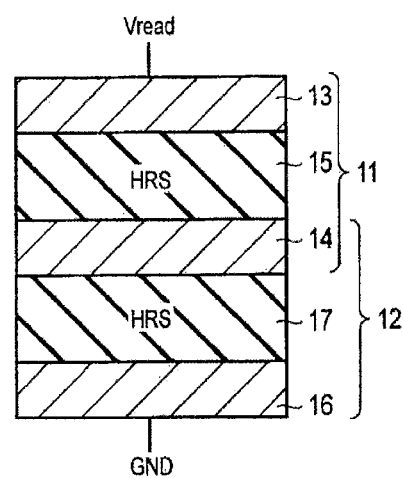
Figure 6C:
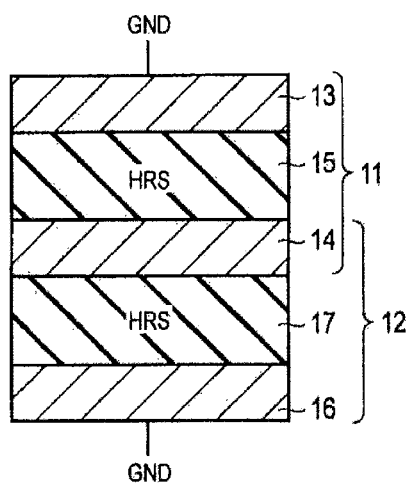

FIGS. 5A to 5C are cross sectional diagrams showing the read operation for the "1" state of the resistance-variable memory device of the first embodiment. FIGS. 6A to 6C are cross sectional diagrams showing the read operation for the "0" state of the resistance-variable memory device of the first embodiment.

The read operation is carried out by applying a readout voltage Vread in the same bias direction as the voltage applied during the write operation. As shown, the positive voltage Vread is applied to the electrode 13 while electrode 16 is connected to ground. However, the reverse operation can also be carried out by applying a backward voltage, that is, by applying a positive voltage to the electrode 16 while electrode 13 is connected to ground.

The read operation may be performed while the resistance-variable memory device 10 is in the "0" state or the "1" state. The resistance state of the variable resistance layer 17 is affected differently depending on whether the device is in the "0" state or the "1" state. With reference to FIGS. 5A to 5C, the read operation while the device is in the "1" state will be explained. FIG. 5A shows the case in which the resistance-variable memory device is in the "1" state. As shown in FIG. 5B, when the device is in the "1" state, as a readout voltage Vread is applied, the variable resistance layer 17 moves to a low-resistance state. At that time, as the readout voltage Vread is applied, because the variable resistance layer 15 is in the state "1" (low-resistance state) the variable resistance layer 17 moves to a low-resistance state. On the other hand, if the variable resistance layer 15 is in the "0" state (high-resistance state), the variable resistance layer 17 maintains a high-resistance state.

As a result, once the readout voltage is applied, both the variable resistance layers 15 and 17 are in a low-resistance state, attaining conduction between the electrodes 13 and 16. Therefore, the low-resistance state of the variable resistance layer 15 as an information storage layer can be read out.

Next, after the read operation, the variable resistance layer 17 moves back to a high-resistance state when the readout voltage is cut off. For this reason, the operation for setting the variable resistance layer 17 as a switching layer to a high-resistance state is not basically required. This is one of the advantages of the use of the resistance-variable memory device of this embodiment. After the read operation and after the readout voltage is cut off, the variable resistance layer 17 returns to a high-resistance state, thus being able to reduce the leak current that is generated in nonselective cells by sneak currents during the write, readout, and erase operations.

Next, the read operation while the device is in the "0" state will be explained with reference to FIGS. 6A to 6C. FIG. 6A shows the case in which the resistance-variable memory device is in the "0" state. While the device is in this state, even if the readout voltage Vread is applied, the variable resistance layer 17 does not move to a low-resistance state but maintains the high-resistance state. The reason for this is that the variable resistance layer 15 is in a high-resistance state, and causes a large voltage drop across the variable resistance layer 15.

As mentioned above, during the read operations while the device is in the "1" state, the resistance of variable resistance layer 17 is lowered, whereas during the read operations while the device is in the "0" state, the variable resistance layer 17 maintains the high-resistance state. In other words, during read operations while the device is in the "1" state, the voltage applied across the variable resistance layer 17 causes it to move to the low resistance state. In opposite fashion, during the read operation while the device is in the "0" state, the variable resistance layer 17 does not move to the low resistance state, but maintains the high resistance state at all times.

In addition, in the resistance-variable memory device of the first embodiment, to realize a more stable memory operation, a process for raising the resistance of the variable resistance layer 17 can also be carried out after the write, erase, or read operation. In this case, the variable resistance layer 17 can move easily to a high-resistance state because the data retention characteristic is poor and the low-resistance state is unstable. In other words, even in case a process for raising the resistance of the variable resistance layer 17 is executed after the write, erase, and read operations, the variable resistance layer 17 can be moved to a high-resistance state at low voltage.

Next, experimental results for the structure of the resistance-variable memory device of the first embodiment will be explained.

The resistance-variable element 11 and the resistance-variable element 12 have been tested and evaluated. The results are mentioned below. The resistance-variable elements used in the test were formed by stacking on a Si substrate. TiN was used in the lower electrode, hafnium oxide (film thickness: 20 nm) was used in the variable resistance layer, and W or Pt was used in the upper electrode. In other words, in the resistance-variable element 11, a stacking structure of TiN/HfOx/W was formed as the electrode 14/variable resistance layer 15/electrode 13. In the resistance-variable element 12, a stacking structure of TiN/HfOx/Pt was formed as the electrode 14/variable resistance layer 17/electrode 16.

Figure 7:
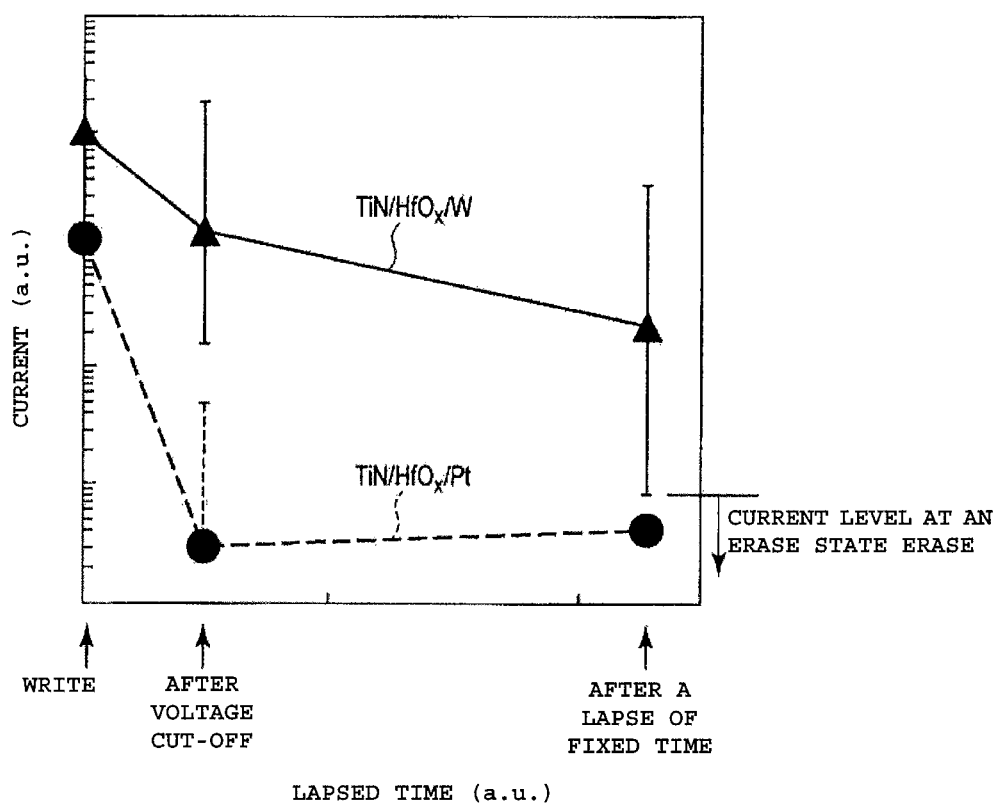
FIG. 7 is a diagram showing a data retention characteristic of the resistance-variable element of the first embodiment.

FIG. 7 shows the evaluation results of the data retention characteristic of the resistance-variable elements 11 and 12. The resistance of the hafnium oxide as a variable resistance layer is lowered by applying a voltage, and the voltage is then cut off. The change in the value of the current flowing through the variable resistance layer until the lapse of a fixed time is shown in FIG. 7. The transition of the resistance-variable elements 11 and 12 to a low-resistance state is achieved by applying a positive set voltage.

In FIG. 7, a dependency of the data retention of the low-resistance state on an electrode type is distinctly shown. It is shown that the resistance-variable element using Pt as the upper electrode moves to a high-resistance state (current level at a time of erase) when the voltage is cut off. On the other hand, it is shown that a resistance-variable element using W as the upper electrode maintains a low-resistance state, even after the lapse of a fixed time. Therefore, it is made clear that a distinctly different data retention can be obtained by using different types of upper electrode, that is, the electrode to which a positive set voltage is applied.

In addition, from analysis, it has been understood that an excellent data retention can be obtained by using an electrode composed of material with a low ionization energy in the electrode, to which a positive set voltage is applied, or a material with a high melting point in the electrode to which a positive set voltage is applied when an oxide is formed. On the contrary, it is understood that a poor data retention may result when using a material with high ionization energy or a low melting point when an oxide is formed. The poor data retention of a material means that its resistance changes from low-resistance to high-resistance after the set voltage is cut off.

A metal oxide, in particular hafnium oxide, is used as a material in variable resistance layers 15 and 17. Aluminum oxide, titanium oxide, tantalum oxide, nickel oxide, tungsten oxide, etc., can be used as an alternative to the hafnium oxide. Furthermore, the materials of the variable resistance layers 15 and 17 may be the same or different. The film thickness of the variable resistance layers 15 and 17 is typically 1-100 nm. In consideration of the operation voltage of the resistance-variable memory device, since a thin film thickness is favorable, the film thickness is preferably 1-20 nm.

The write operation, the erase operation, and the read operation, while the device is in the "1" state, lowers the resistance of the variable resistance layer 17 in the resistance-variable element 12. For this reason, to realize a low-voltage operation or to prevent an erroneous write during the read operation, it is desirable for an operation voltage (hereinafter referred to as Vset2) above which the resistance of the variable resistance layer 17 is lowered to be set lower than an operation voltage (hereinafter referred to as Vset1) above which the resistance of the variable resistance layer 15 is lowered. For example, Vset2/Vset1 can be set to a value of 1:2 to 1:10. This can be achieved by adjusting the film thickness ratio of the variable resistance layers 17 and 15.

As the material of the electrode 13, a metallic material with low ionization energy or a high melting point, when an oxide thereof is formed, can be used. Specifically, Al, Ti, In, Ga, V, Cr, Nb, Zr, Mg, Hf, etc., can be used in addition to W.

As the materials of the electrodes 14 and 16, a metallic material with high ionization energy or a low melting point, when a metallic oxide is formed in the electrode 13, can be used. Specifically, Au, Zn, Pd, Ir, etc., can be used in addition to Pt. The materials of the electrodes 14 and 16 may be the same or different. However, the use of the same material is preferable to obtain an equivalent switching characteristic even when the polarity of the voltage across the electrode is reversed.

As explained above, according to the first embodiment, a resistance-variable memory device, which has a leak current suppression function and enables a stable memory operation, can be provided.

(Embodiment 2)

In the first embodiment, metal oxide is used in the variable resistance layer 15 of the resistance-variable element 11 with a good data retention characteristic; however, in a second embodiment, the use of materials other than metal oxide, such as semiconductors, will be explained.

Figure 8:
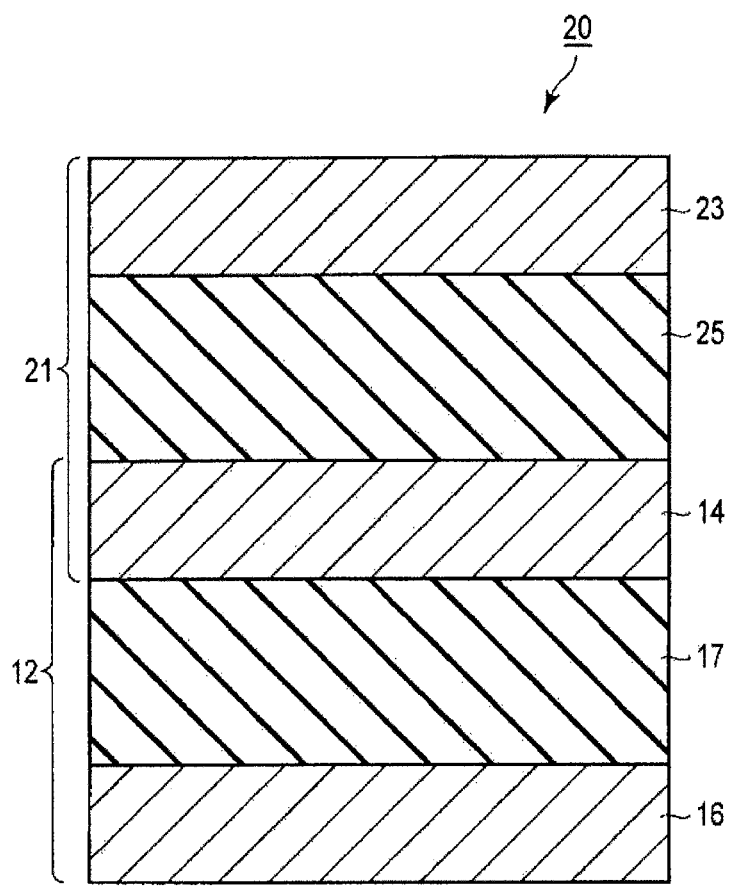
FIG. 8 is a cross section showing the structure of a resistance-variable memory device according to a second embodiment.

FIG. 8 is a cross section showing the structure of the resistance-variable memory device of the second embodiment.

As shown in the figure, the resistance-variable memory device 20 has a structure provided with a resistance-variable element 21 and a resistance-variable element 12. The resistance-variable element 21 has two electrodes-electrode 23, electrode 14. It also includes variable resistance layer arranged between the electrodes 23 and 14. The resistance-variable element 12 has a structure similar to the structure of the corresponding component in the first embodiment.

The resistance-variable element 21 and the resistance-variable element 12 are electrically connected in series by the electrode 14. As a method for connecting the resistance-variable element 21 and the resistance-variable element 12, a structure can be used in which the resistance-variable element 21 and the resistance-variable element 12 are stacked in a direction perpendicular to the surface of a substrate. In this structure, the resistance-variable element 21 and the resistance-variable element 12 are stacked, and the electrode 14 is a common electrode. In addition, an alternative structure may be used in which the resistance-variable element 21 and the resistance-variable element 12 are arranged on the substrate surface, and the common electrode 14 is installed so as to be in contact with both resistance-variable elements 21 and 12.

FIG. 8 shows the structure in which the resistance-variable element 21 and the resistance-variable element 12 are stacked. Either of the resistance-variable element 21 and the resistance-variable element 12 is a resistance-variable memory device in which the resistance value of the variable resistance layer changes as a voltage is applied. The variable resistance layer moves to a low-resistance state as a write voltage is applied, and the variable resistance layer moves to a high-resistance state as an erase voltage is applied. In addition, both the resistance-variable element 21 and the resistance-variable element 12 are bipolar resistance-variable elements in which the write-voltage applying direction is opposite to the erase-voltage applying direction.

In the resistance-variable element 21, the material that forms the electrode 23 is ionized and moved, generating a metallic conductive filament in the variable resistance layer 25. With the generation of this filament, the resistance of the variable resistance layer 25 is lowered. Thus, in general, the resistance-variable element 21 is a memory element having a resistance change mechanism.

The material with which the variable resistance layer 25 is composed of may be, for example, semiconductors such as silicon, germanium, silicon germanium, and carbon-doped silicon. As used, these semiconductors are preferably in an amorphous state, but the semiconductors may also be in a crystallized state. In addition, as other examples, semiconductor oxides such as silicon oxide and germanium oxide may be used. The thickness of the variable resistance layer 25 is typically 1-300 nm. In consideration of the operation voltage of the resistance-variable memory device, since a thin film thickness is favorable, the film thickness is preferably 1-20 nm.

As the material for the electrode 23, for example, metals such as Ag, Cu, Al, Ni, Ti, Co, Mg, Cr, Mn, Fe, Zn, Sn, In, Pd, Pb, Bi, and Au, which are easily ionized, can be used.

The materials for the electrodes 14 and 16 are similar to the materials for the corresponding components of the first embodiment. In addition, material for the variable resistance layer 17 is also similar to the material for the corresponding component of the first embodiment. In addition, other constitutions and effects including the memory operation principle are similar to those of the first embodiment.

(Embodiment 3)

In a third embodiment, an example will be explained in which a silicon film is used in the variable resistance layer of one of the resistance-variable elements (leak-current prevention layer) with a poor data retention characteristic and in which a silicon oxide film is used in the other variable resistance layer of a resistance-variable element with a good data retention characteristic.

Figure 9:
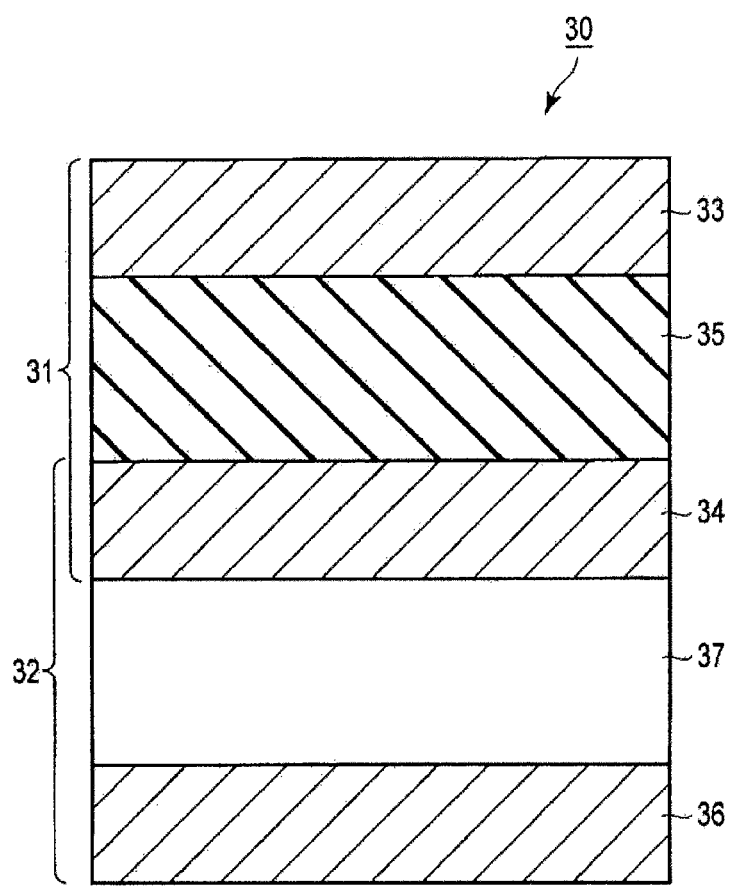
FIG. 9 is a cross section showing the structure of a resistance-variable memory device according to a third embodiment.

FIG. 9 is a cross section showing the structure of the resistance-variable memory device of the third embodiment.

As shown in the figure, the resistance-variable memory device 30 has a structure provided with a resistance-variable element 31 and a resistance-variable element 32. The resistance-variable element 31 has electrode (first electrode) 33, electrode 34, and variable resistance layer 35 arranged between the electrodes 33 and 34. The resistance-variable element 32 has electrode 34, electrode (second electrode) 36, and variable resistance layer 37 arranged between the electrodes 34 and 36.

The resistance-variable element 31 and the resistance-variable element 32 are electrically connected in series via the electrode 34.

As was the case for corresponding components in the first and second embodiments, both resistance-variable element 31 and the resistance-variable element 32 are resistance-variable memory devices in which the resistance value of the variable resistance layer is changed as a voltage is applied. The variable resistance layer moves to a low-resistance state as a write voltage is applied, and the variable resistance layer moves to a high-resistance state as an erase voltage is applied.

The resistance-variable element 32 is an element that has a poor data retention characteristic, and its resistance is raised when the voltage for lowering the resistance is cut off. The resistance-variable element 31 is an element that has a good data retention characteristic and functions as an information storage layer for holding the state.

As the material of the variable resistance layer 35, as mentioned above, a silicon oxide film is used. As the material of the electrode 33, for example, metals such as Pt, W, Ta, and Mo, which are difficult to be ionized, can be used. As the material of the electrode 34, for example, metals such as Ag, Cu, Al, Ni, Ti, Co, Mg, Cr, Mn, Fe, Zn, Sn, In, Pd, Pb, Bi, and Au, which are easily ionized, can be used.

As the material of the variable resistance layer 37, as mentioned above, silicon is used. As the material of the electrode 36, for example, metals such as Ag, Cu, Al, Ni, Ti, Co, Mg, Cr, Mn, Fe, Zn, Sn, In, Pd, Pb, Bi, and Au, which are easily ionized, can be used.

Next, write, erase, and read operations in the resistance-variable memory device of the third embodiment will be explained with reference to FIGS. 3A to 3C, 4A to 4D, 5A to 5C, and 6A to 6C, as needed.

First, a voltage is applied as follows in the write operation. In the first embodiment, a positive voltage Vset for the second electrode 16 is applied to the first electrode 13; however, in the third embodiment, a reverse bias voltage is applied. In other words, a positive voltage Vset is applied to the second electrode 36.

In addition, a voltage is applied as follows in the erase operation. In the first embodiment, a positive erase voltage Vreset for the first electrode 13 is applied to the second electrode 16; however, in the third embodiment, a reverse bias voltage is applied. In other words, a positive erase voltage Vreset is applied to the first electrode 33.

Moreover, in the read operation, a readout voltage Vread of any bias may be applied across the first electrode 33 and the second electrode 36. In other words, a positive readout voltage Vread may be applied to the second electrode 36, and a positive readout voltage Vread may be applied to the first electrode 33.

Other constitutions and effects including the memory operation principle in the resistance-variable memory device of the third embodiment are similar to those of the first embodiment.

(Embodiment 4)

In a fourth embodiment, a structure in which several resistance-variable elements (leak-current prevention layers) with a poor data retention characteristic are connected in series is used. Here, an example in which two resistance-variable elements each with poor data retention characteristic are connected in series, is explained. As shown, three layers of resistance-variable elements with poor data retention characteristic may also be superposed.

Figure 10:
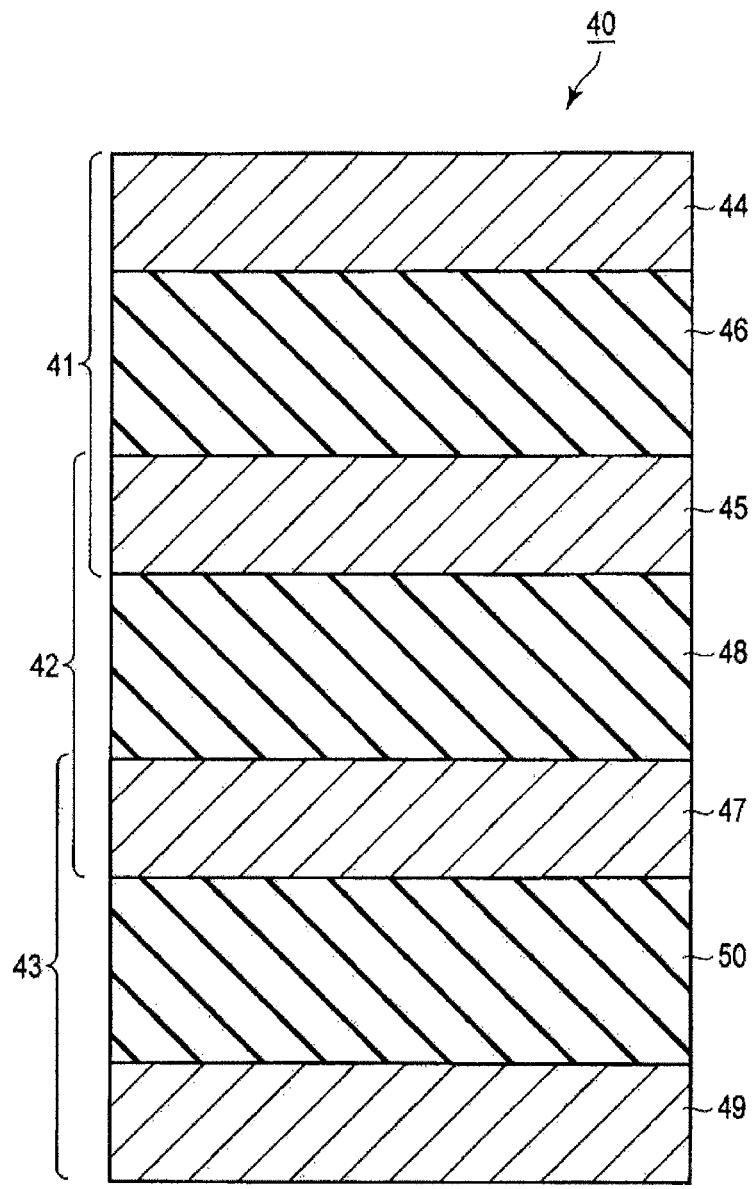
FIG. 10 is a cross section showing the structure of a resistance-variable memory device according to a fourth embodiment.

FIG. 10 is a cross section showing the structure of the resistance-variable memory device of the fourth embodiment.

As shown in the figure, the resistance-variable memory device 40 is provided with resistance-variable element 41, resistance-variable element 42, and resistance-variable element 43. The resistance-variable element 41 has electrode 44, electrode 45, and variable resistance layer 46 arranged between the electrodes 44 and 45. The resistance-variable element 42 has electrode 45, electrode 47, and variable resistance layer 48 arranged between the electrodes 45 and 47. The resistance-variable element 43 has electrode 47, electrode 49, and variable resistance layer 50 arranged between the electrodes 47 and 49.

The resistance-variable element 41 and the resistance-variable element 42 are electrically connected in series via the electrode 45. The resistance-variable element 42 and the resistance-variable element 43 are electrically connected in series via the electrode 47. A structure for use in the method for connecting the resistance-variable elements 41, 42, and 43, is shown. In this structure, the resistance-variable elements 41, 42, and 43 are stacked in the direction perpendicular to the surface of a substrate, that is, a structure in which the resistance-variable element 41 and the resistance-variable element 42 are stacked such that electrode 45 is a common electrode, and the resistance-variable element 42 and the resistance-variable element 43 are stacked such that the electrode 47 is a common electrode. In addition to the aforementioned structure, there is a structure in which the resistance-variable elements 41, 42, and 43 are respectively arranged on the substrate surface and the common electrodes 45 and 47 are respectively installed, etc.

Two resistance-variable elements of the resistance-variable elements 41, 42, and 43 are elements that each have poor data retention characteristics, and their resistance is raised when the voltage for lowering their resistance has been cut off. The remaining one resistance-variable element is an element that has a good data retention characteristic and functions as an information storage layer for holding the state. For example, the resistance-variable element 41 is an element with good data retention characteristic, and both the resistance-variable elements 42 and 43 are elements each with poor data retention characteristic.

The materials of the resistance-variable elements 41, 42 and 43 in the fourth embodiment are similar to those of the resistance-variable elements 11, 12, 21, 31, and 32 in the first, second and third embodiments. In other words, for example, to form resistance-variable elements 42 and 43 with poor data retention characteristic, the same material of the resistance-variable element 12 of the first embodiment or the material of the resistance-variable element 32 of the third embodiment, can be used. To form resistance-variable elements 41 with a good data retention characteristic, the same material used to form the resistance-variable element 11 of the first embodiment, or the material constituting the resistance-variable element 21 of the second embodiment or the material constituting the resistance-variable element 31 of the third embodiment, can be used. Other constitutions and effects including the memory operation principle are similar to those of the first embodiment.

(Embodiment 5)

In a fifth embodiment, a cross point type resistance-variable memory in which the resistance-variable memory devices of any of the first, second, third, and fourth embodiments may be arranged at the intersecting parts of lower wirings and upper wirings will be explained.

The resistance-variable memory devices of the first, second, third, and fourth embodiments function as memory cells and do not depend upon the method for connecting the memory cells, so any memory devices can be applied. For example, as a storage device that is substituted for the NAND type flash memory, a so-called cross point type of memory array in which the resistance-variable memory devices of the first to fourth embodiments are inserted into the intersecting part of upper wirings and the lower wirings can be applied. In addition, a cross point type three-dimensional stacking structure can be applied.

Figure 11:
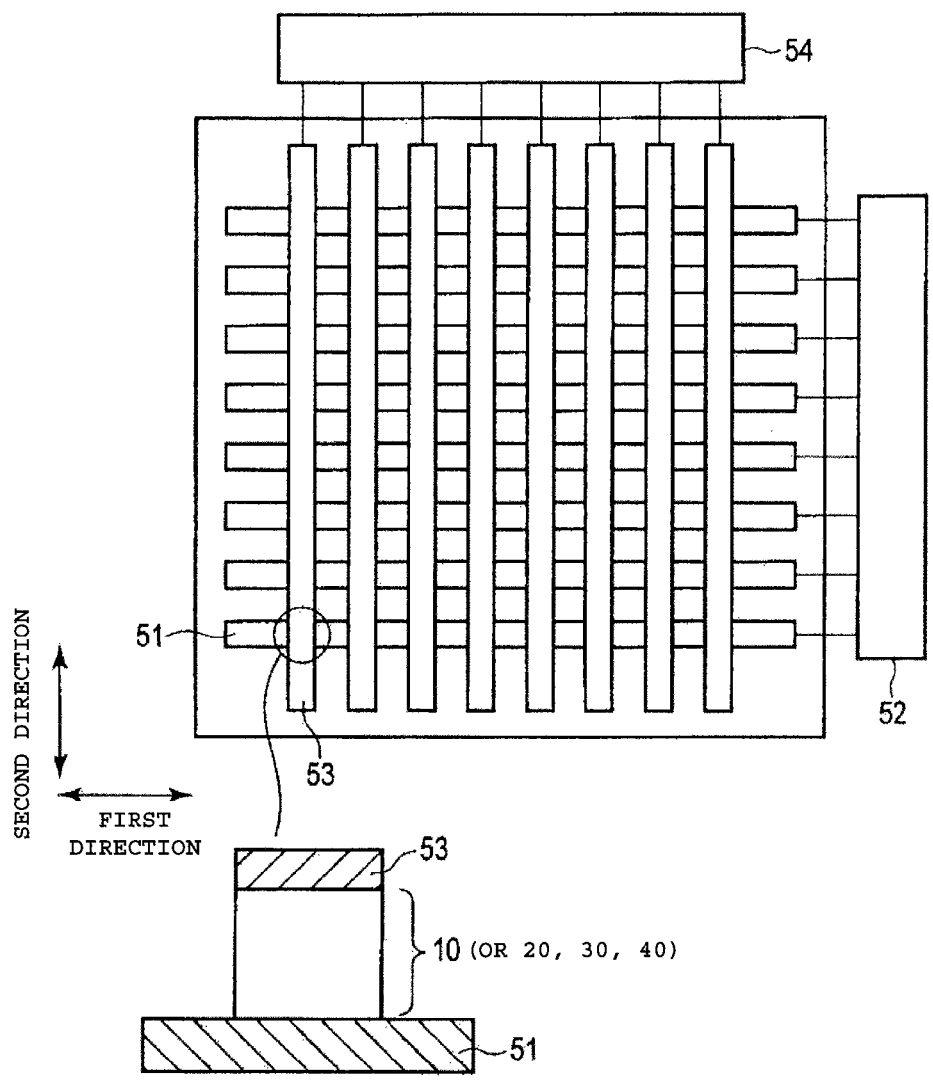
FIG. 11 is a diagram showing the structure of a cross point type of memory array according to an embodiment.

FIG. 11 shows the cross point type of memory array of the fifth embodiment. Several lower wirings 51 extended in a first direction are arranged in a second direction, and a control circuit 52 for driving the lower wirings is connected to the lower wirings 51. Several upper wirings 53 extended in the second direction are arranged in the first direction above the lower wirings 51, and a control circuit 54 for driving the upper wirings is connected to the upper wirings 53. At the intersecting parts of the lower wirings 51 and the upper wirings 53, the resistance-variable memory devices 10, 20, 30, and 40 of the first, second, third, and fourth embodiments are arranged.

In the fifth embodiment, a structure in which the devices are respectively, vertically inverted can also be applied, and a stacked cross point type resistance-variable memory can be formed. Other constitutions and effects are similar to those of the first, second, third, and fourth embodiments.

According to the fifth embodiment, a cross point type resistance-variable memory provided with resistance-variable memory devices, which have a leak-current suppression function and enable a stable memory operation, can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance-variable memory device, comprising:
a first electrode, second electrode and third electrode;
a first variable resistance layer disposed between the first electrode and the third electrode; and
a second variable resistance layer disposed between the second electrode and the third electrode,
wherein the first electrode, the second electrode, the third electrode, the first variable resistance layer, and the second variable resistance layer are formed of materials that cause the first variable resistance layer to transition from a first resistance state to a second resistance state when a differential voltage is applied across the first and second electrodes and maintain the second resistance state when the differential voltage is cut off, and cause the second variable resistance layer to transition from a third resistance state to a fourth resistance state when the differential voltage is applied across the first and second electrodes and transition from the fourth resistance state to the third resistance state when the differential voltage is cut off, and
wherein the material for the first variable resistance layer provides greater resistance against current flowing from the first electrode to the third electrode when in the first resistance state than when in the second resistance state, and the second variable resistance layer provides greater resistance against current flowing from the third electrode to the second electrode when in the third resistance state than when in the fourth resistance state.

2. The resistance-variable memory device of claim 1, wherein a threshold voltage for causing the material for the first variable resistance layer to transition from the first resistance state to the second resistance state is greater than a threshold voltage for causing the material for the second variable resistance layer to transition from the third resistance state to the fourth resistance state.

3. The resistance-variable memory device of claim 1, wherein:
the first electrode comprises W;
the second electrode comprises Pt;
the third electrode comprises TiN; and
the first variable resistance layer and the second variable resistance layers are each formed of a metal oxide.

4. The resistance-variable memory device of claim 3, wherein the metal oxide is $HfO_x$.

5. The resistance-variable memory device of claim 1, wherein:
the first electrode comprises at least one of W, Al, Ti, In, Ga, V, Cr, Nb, Zr, Mg, and Hf;
the second electrode comprises at least one of Pt, Au, Zn, Pd, and Ir;
the third electrode comprises at least one of Pt, Au, Zn, Pd, and Ir; and
the first variable resistance layer and the second variable resistance layers are each formed of a metal oxide.

6. The resistance-variable memory device of claim 1, wherein:
the first electrode comprises at least one of Ag, Cu, Al, Ni, Ti, Co, Mg, Cr, Mn, Fe, Zn, Sn, In, Pd, Pb, Bi, and Au;
the second electrode comprises at least one of Pt, Au, Zn, Pd, and Ir;
the third electrode comprises at least one of Pt, Au, Zn, Pd, and Ir;
the first variable resistance layer is formed of at least one of a semiconductor and a semiconductor oxide; and
the second variable resistance layer is formed of a metal oxide.

7. The resistance-variable memory device of claim 1, wherein:
the first electrode comprises at least one of Pt, W, TiN, Ta, and Mo;
the second electrode comprises at least one of Ag, Cu, Al, Ni, Ti, Co, Mg, Cr, Mn, Fe, Zn, Sn, In, Pd, Pb, Bi, and Au;
the third electrode comprises at least one of Ag, Cu, Al, Ni, Ti, Co, Mg, Cr, Mn, Fe, Zn, Sn, In, Pd, Pb, Bi, and Au;
the first variable resistance layer is formed of a semiconductor oxide; and
the second variable resistance layer is formed of a semiconductor.

8. The resistance-variable memory device of claim 1, further comprising:
a fourth electrode; and
a third variable resistance layer disposed between the second electrode and the fourth electrode,
wherein the fourth electrode and the third variable resistance layer are formed of materials that cause the third variable resistance layer to transition from a fifth resistance state to a sixth resistance state when the differential voltage is applied across the first and fourth electrodes and transition from the sixth resistance state to the fifth resistance state when the differential voltage is cut off, and wherein the third variable resistance layer provides greater resistance against current flowing from the second electrode to the fourth electrode when in the fifth resistance state than when in the sixth resistance state.

9. The resistance-variable memory device of claim 8, wherein:

the fourth electrode comprises at least one of Pt, Au, Zn, Pd, and Ir; and the third variable resistance layer is formed of a metal oxide.

10. A resistance-variable memory device, comprising:

a first electrode containing at least one of W, Al, Ti, In, Ga, V, Cr, Nb, Zr, Mg, and Hf;

a second electrode containing at least one of Pt, Au, Zn, Pd, and Ir;

a third electrode provided between the first electrode and the second electrode and containing at least one of Pt, Au, Zn, Pd, and Ir;

a first variable resistance layer provided between the first electrode and the third electrode and formed of a metal oxide; and a second variable resistance layer provided between the second electrode and the third electrode and formed of a metal oxide, wherein a first differential voltage associated with a write operation or a second differential voltage associated with an erase operation, when applied across the first and second electrodes, causes the second variable resistance layer to transition from a first resistance state to a second resistance state, the first differential voltage, when applied across the first and second electrodes, causes data to be written to the first variable resistance layer, and the second variable resistance layer transitions from the second resistance state to the first resistance state when either the first or second differential voltage applied across the first and second electrodes is terminated.

11. The resistance-variable memory device of claim 10, wherein a third differential voltage associated with a read operation, when applied across the first and second electrodes, causes the second variable resistance layer to transition from a first resistance state to a second resistance state, when data is written to the first variable resistance layer, and does not change the resistance state of the second variable resistance layer, when data is not written to the first variable resistance layer.

12. The resistance-variable memory device of claim 11, wherein a threshold voltage for causing the first variable resistance layer to transition from a third resistance state to a fourth resistance state is greater than a threshold voltage for causing the second variable resistance layer to transition from the first resistance state to the second resistance state, and wherein the first differential voltage, when applied across the first and second electrodes, causes the first variable resistance layer to transition from the third resistance state to the fourth resistance state.

13. The resistance-variable memory device of claim 10, wherein the second variable resistance layer is in contact with the second electrode and the third electrode.

14. The resistance-variable memory device of claim 10, wherein the second variable resistance layer is the only layer disposed between the second electrode and the third electrode.

15. A resistance-variable memory device, comprising:

a first electrode containing at least one of Ag, Cu, Al, Ni, Ti, Co, Mg, Cr, Mn, Fe, Zn, Sn, In, Pd, Pb, Bi, and Au;

a second electrode containing at least one of Pt, Au, Zn, Pd, and Ir;

a third electrode provided between the first electrode and the second electrode and containing at least one of Pt, Au, Zn, Pd, and Ir;

a first variable resistance layer provided between the first electrode and the third electrode and formed of a semiconductor or semiconductor oxide; and a second variable resistance layer provided between the second electrode and the third electrode and formed of a metal oxide, wherein a first differential voltage associated with a write operation or a second differential voltage associated with an erase operation, when applied across the first and second electrodes, causes the second variable resistance layer to transition from a first resistance state to a second resistance state, the first differential voltage, when applied across the first and second electrodes, causes data to be written to the first variable resistance layer, and the second variable resistance layer transitions from the second resistance state to the first resistance state when either the first or second differential voltage applied across the first and second electrodes is terminated.

16. The resistance-variable memory device of claim 15, wherein a third differential voltage associated with a read operation, when applied across the first and second electrodes, causes the second variable resistance layer to transition from a first resistance state to a second resistance state, when data is written to the first variable resistance layer, and does not change the resistance state of the second variable resistance layer, when data is not written to the first variable resistance layer.

17. The resistance-variable memory device of claim 15, wherein the second variable resistance layer is in contact with the second electrode and the third electrode.

18. The resistance-variable memory device of claim 15, wherein the second variable resistance layer is the only layer disposed between the second electrode and the third electrode.

* * * * *